United States Patent [19]

Takahashi et al.

[11] Patent Number: 5,004,925
[45] Date of Patent: Apr. 2, 1991

[54] METHOD AND APPARATUS FOR DETECTING ALIGNMENT MARK OF SEMICONDUCTOR DEVICE

[75] Inventors: Yasushi Takahashi, Kawasaki; Hiroshi Yasuda, Yokohama, both of Japan

[73] Assignee: Fujitsu Limited, Kawasaki, Japan

[21] Appl. No.: 489,224

[22] Filed: Mar. 6, 1990

[30] Foreign Application Priority Data

Mar. 6, 1989 [JP] Japan .................................. 1-52136

[51] Int. Cl.⁵ .............................................. H01J 37/30
[52] U.S. Cl. ................................. 250/491.1; 250/492.2
[58] Field of Search ........................... 250/491.1, 492.2

[56] References Cited

U.S. PATENT DOCUMENTS

| | | | |
|---|---|---|---|
| 4,503,334 | 3/1985 | King et al. | 250/491.1 |
| 4,590,382 | 5/1986 | Tabata | 250/491.1 |
| 4,871,919 | 10/1989 | Donohue et al. | 250/491.1 |
| 4,885,472 | 12/1989 | Young | 250/491.1 |
| 4,896,045 | 1/1990 | Okunuki et al. | 250/492.2 |

FOREIGN PATENT DOCUMENTS

| | | | |
|---|---|---|---|
| 54-81782 | 6/1979 | Japan . | |
| 0207637 | 12/1983 | Japan | 250/491.1 |

*Primary Examiner*—Bruce C. Anderson
*Attorney, Agent, or Firm*—Staas & Halsey

[57] ABSTRACT

In a semiconductor device having a leveling metal layer for forming a flat surface on an alignment mark of a level-difference, charged particles are irradiated and scanned onto a region of the alignment mark, and information generated from the region of the alignment mark in accordance with the thickness of metal of a metal leveling-layer in the level-difference of the alignment mark is detected. Therefore, even when the alignment mark formed by the level-difference in the semiconductor device is buried under the leveling metal layer, the alignment mark can be detected exactly without adding excessive processes.

19 Claims, 10 Drawing Sheets

SEVERAL TENS OF μm

METHOD AND APPARATUS FOR DETECTING ALIGNMENT MARK OF SEMICONDUCTOR DEVICE

BACKGROUND OF THE INVENTION

1. Field of the Invention

The present invention relates to a technique for detecting an alignment mark and, more particularly, to a method and an apparatus for detecting an alignment mark of a semiconductor device having a leveling metal layer for forming a flat surface of the semiconductor device, in an electron beam exposure system, and the like.

2. Description of the Related Art

Recently, in the art of producing semiconductor devices using an electron beam exposure system, hyperfine patterns will be required in accordance with an improvement of a large scale integration in the semiconductor device. Therefore, the patterns should be exactly formed on a semiconductor wafer and a correction process (alignment process) becomes important. Namely, in the electron beam exposure system, in order to irradiate an electron beam and form patterns on the semiconductor wafer exactly, a coordinate of a control unit of the electron beam exposure system should be made to agree with a practical position on the semiconductor wafer by using the alignment mark. Note, this alignment process is also used for compensating a distortion of a deflection unit in the electron beam exposure system, so that the electron beam is exactly irradiated on the semiconductor wafer and specific patterns are exactly formed thereon.

In a conventional alignment process used in an electron beam exposure system for forming specific patterns by an electron beam, an alignment mark is formed on a semiconductor wafer (substrate), and an alignment process is carried out by detecting positional information of the alignment mark. Namely, the alignment mark is generally formed on the substrate as a level-difference (irregularity) using an RIE method and the like, and then an insulation layer and the like is formed on the substrate. Note, the alignment mark is also formed on the insulation layer as a level-difference. In both cases, the alignment process is carried out by the steps of: scanning an electron beam to cross over the level-differences of the alignment mark, determining a center position of the alignment mark by detecting reflected electrons (secondary electrons) from the level-differences, calculating a correction coefficient by detecting a difference of the center position of the alignment mark, and carrying out an alignment, for example, compensating a distortion of a deflection unit in the electron beam exposure system (with reference to Japanese Unexamined Patent Publication No. 54-81782).

However, in a manufacturing process of a semiconductor device, a new layer is formed as a flat surface to increase the reliability of the semiconductor device and make a formation process of the next layer easy. Namely, when a metal layer is formed as a flat surface on the insulation layer having an alignment mark formed by a level-difference, the level-difference alignment mark is buried under the metal layer (leveling metal layer), and thus a detection process of detecting the level-difference alignment mark cannot be carried out. In this case, according to the prior art, an area of the alignment mark or close to the level-difference is gouged out for detection. In this manner, there is a problem that a process for gouging out the level-difference alignment mark must be carried out.

SUMMARY OF THE INVENTION

It is an object of the present invention to provide an alignment mark detection technique of a semiconductor device having a simple alignment mark detection process without excessive processes after carrying out a layer leveling process.

According to the present invention, there is provided a method of detecting an alignment mark of a semiconductor device having a leveling metal layer for forming a flat surface on the alignment mark of a level-difference type, wherein the method comprises a step of irradiating and scanning charged particles onto a region of the alignment mark, and a step of detecting information generated from the region of the alignment mark in accordance with the thickness of the metal in the level-difference alignment mark, so that the position of the alignment mark is detected.

According to the present invention, there is also provided a method of detecting an alignment mark of a semiconductor device having a leveling metal layer for forming a flat surface on a level-difference alignment mark, wherein the method comprises a step of defining a flat surface alignment mark by the different thickness of the leveling metal layer in the level-difference alignment mark, a step of irradiating and scanning an electron beam onto a region of the defined flat surface alignment mark, a step of detecting an X-ray generated from the region of the flat surface alignment mark in accordance with the metal layer thickness in the flat surface alignment mark, and a step of determining the position of the flat surface alignment mark by the intensity of the detected X-ray.

Furthermore, according to the present invention, there is provided an apparatus for detecting an alignment mark of a semiconductor device having a leveling metal layer for forming a flat surface on a level-difference alignment mark, wherein the apparatus comprises a means for irradiating and scanning charged particles onto a region of the alignment mark, and a detection means, provided over the semiconductor device, for detecting information generated from the region of the alignment mark in accordance with the thickness of a metal layer in the level-difference alignment mark, so that the position of the alignment mark is detected.

The charged particles may be constituted by an electron beam, and the information generated from the region of the alignment mark may be an X-ray intensity. The detection means may comprise an electron intercept means, provided at the side of the semiconductor device in the detection means, for intercepting electrons reflected by a surface of the semiconductor device, and PIN-diodes, contacted to the electron intercept means, for detecting an X-ray passing through the electron intercept means.

The electron intercept means may comprise a voltage applying means, so that the electrons reflected by the semiconductor device are intercepted when the voltage applying means is switched ON, and the electrons reflected by the semiconductor device are passed through the intercept means when the voltage applying means is switched OFF, and the detection means is also used for detecting the electrons reflected by the semiconductor device in accordance with a surface shape thereof. The electron intercept means may comprise a light metal layer which may be a berylium layer. The apparatus for detecting the alignment mark of the semiconductor device may be used for an electron beam exposure system.

According to the present invention, there is also provided an apparatus for detecting an alignment mark of a semiconductor device having a flat surface alignment mark and a level-difference alignment mark, wherein the apparatus comprises a means for irradiating and scanning an electron beam onto a region of the level-difference alignment mark and the flat surface alignment mark, a first detection means, provided over the semiconductor device, for detecting an X-ray generated from the region of the flat surface alignment mark in accordance with a metal thickness in the flat surface alignment mark, a second detection means, provided over the semiconductor device, for detecting an electron reflected from the region of the level-difference alignment mark in accordance with a surface shape of the level-difference alignment mark, and a switching means, connected to the first detection means and the second detection means, for switching the first detection means and the second detection means in accordance with the type of the flat surface alignment mark and the level-difference alignment mark.

The apparatus may further comprise a control unit, connected to the switching means, for detecting a position of the flat surface alignment mark or the level-difference alignment mark by the detected X-ray intensity or the detected electron intensity, and a CPU, connected to the control unit, for carrying out various controls in accordance with the detected position of the flat surface alignment mark or the level-difference alignment mark. The first detection means and the second detection means may be provided in plural. The first detection means may be formed larger than the second detection means.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, an alignment mark of a semiconductor device will be explained, with reference to FIGS. 1 and 2.

Figure 1:
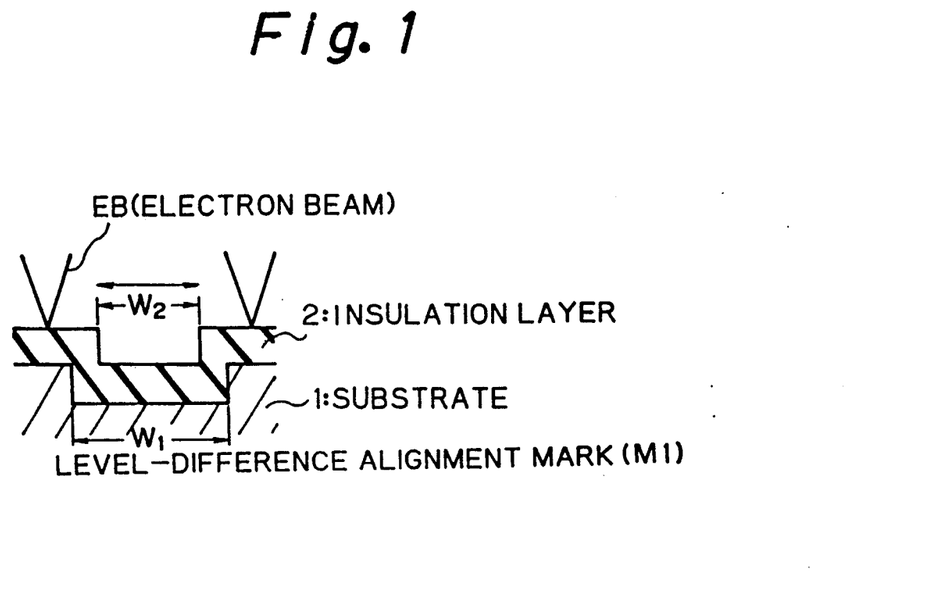
FIG. 1 is a cross sectional diagram for explaining a level-difference alignment mark.

FIG. 1 is a cross sectional diagram for explaining a level-difference alignment mark.

As shown in FIG. 1, a level-difference alignment mark (M1), which is an alignment mark indicating a level-difference, is generally formed on a semiconductor wafer or a substrate 1 as a level-difference (irregularity) using an RIE method and the like. In FIG. 1, an insulation layer 2 is formed on the substrate 1, and the level-difference alignment mark M1 is formed in the insulation layer 2. Note, an external width $W_1$ of the level-difference alignment mark of the substrate 1 is different from an internal width $W_2$ of the level-difference alignment mark of the insulation layer 2, but the center positions of these different alignment mark widths $W_1$ and $W_2$ are the same. In both cases, the alignment process is carried out by the steps of, scanning an electron beam to cross over the level-differences of the alignment mark, determining a center position of the alignment mark by detecting reflected electrons (secondary electrons) from the level-differences, calculating a correction coefficient by detecting a difference of the center position of the alignment mark, and carrying out an alignment of the electron beam exposure system. The alignment of the electron beam exposure system is, for example, to make a coordinate of a control unit of the electron beam exposure system with a practical position on the substrate 1 or the insulation layer 2, or to compensate a distortion of a deflection unit in the electron beam exposure system.

Figure 2:
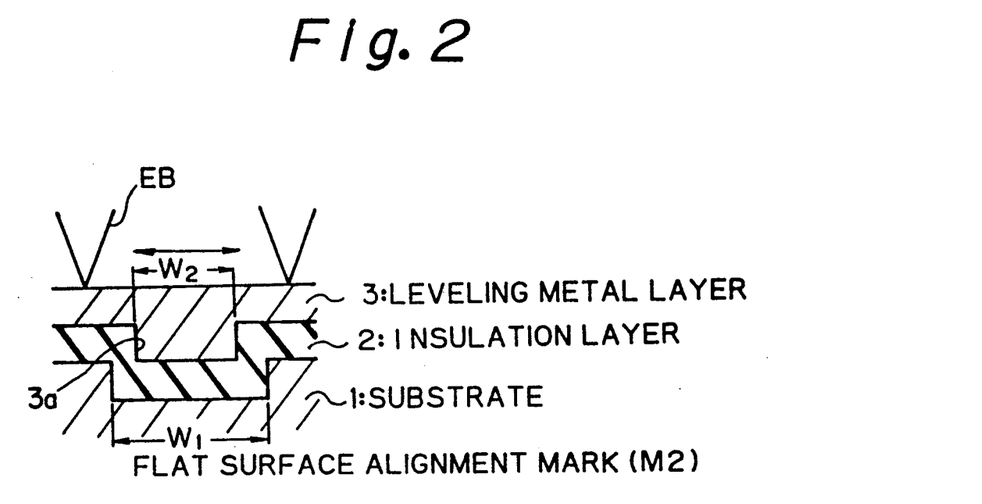
FIG. 2 is a cross sectional diagram for explaining a flat surface alignment mark.

FIG. 2 is a cross sectional diagram for explaining a flat surface alignment mark.

As shown in FIG. 2, a flat surface alignment mark (M2), which is an alignment mark having a flat surface, is formed as a result of a new metal layer 3 being formed on the level-difference alignment mark as a flat surface for increasing the reliability of the semiconductor device and for making a formation process of the next layer easy. Namely, the flat surface alignment mark is formed by a metal layer portion 3a which extends into and fills the irregularity (level-difference) of the level-difference alignment mark and whereby the exposed, top surface of the layer 3 is flat. This flat surface alignment mark cannot be detected by using reflected electrons the same as detecting the level-difference alignment mark, as the level-difference is buried under the metal layer 3. In this case, according to the prior art, an area of the alignment mark or close to the level-difference is gouged out for detection. In this manner, there is a problem that a process for gouging out the alignment mark of the level-difference must be added. However, according to the present invention, this flat surface alignment mark can be detected exactly without adding extraneous processes. Furthermore, according to the present invention, the level-difference alignment mark can be also detected by the same method as the above description with reference to FIG. 1.

Next, a principle of the present invention will be explained.

Figure 3:
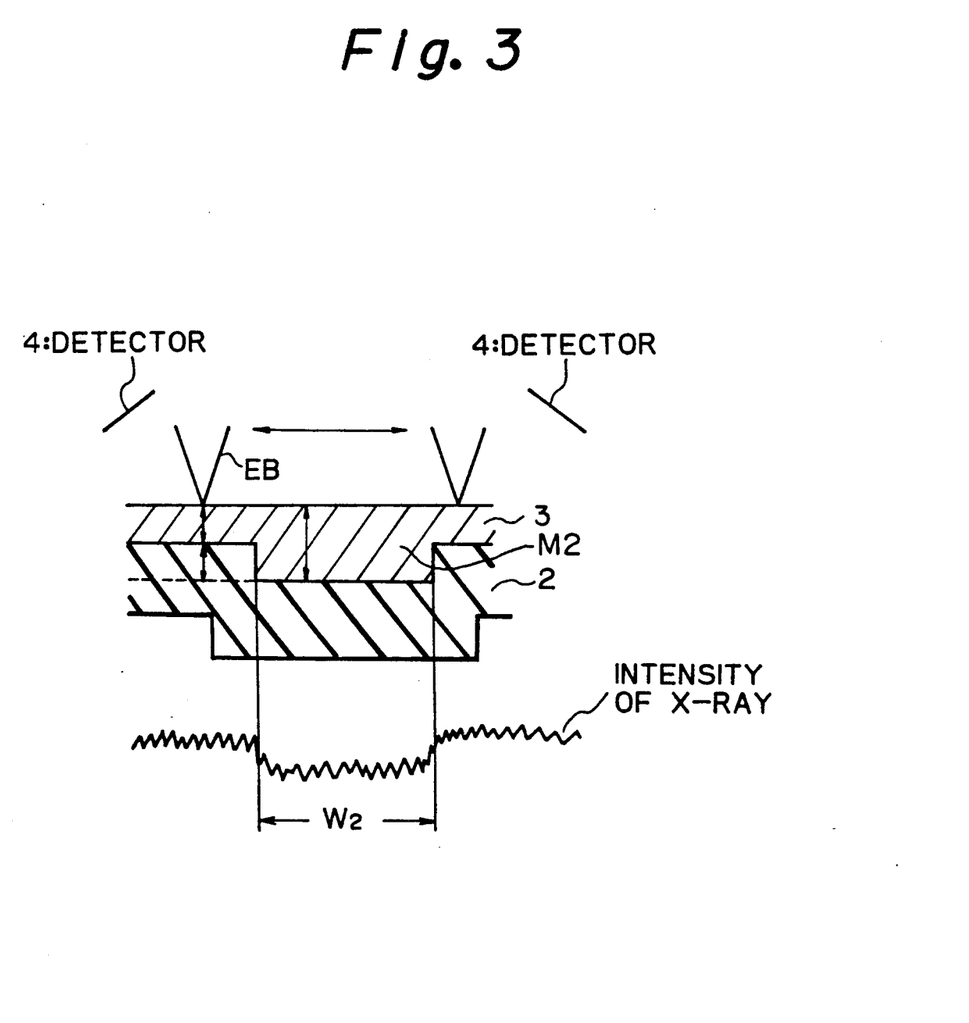
FIG. 3 is a diagram for explaining a basic configuration of the present invention.

FIG. 3 is a diagram for explaining a basic configuration of the present invention.

As shown in FIG. 3, in a semiconductor device having a leveling metal layer 3, charged particles, for example, an electron beam EB, is scanned at a flat surface alignment mark (M2), and information, for example, an X-ray generated from the region of the flat surface alignment mark M2 in accordance with the thickness of a metal layer 3 in the level-difference (irregularity) of the alignment mark, is detected so that the position of the alignment mark M2 can be detected. Note, in this detection method, when scanning the electron beam EB at a region of the alignment mark, electrons reflected by the surface of the metal layer are also generated accompanying the generated X-ray. Therefore, a detector 4 may be constituted by an intercept (includes absorption) means for intercepting (or absorbing) the reflected electrons and PIN-diodes for detecting the X-ray passing through the electron intercept means, and the flat surface alignment mark can be efficiently detected, which will be explained in detail with reference to FIGS. 12 and 13.

In the above descriptions, when irradiating an electron beam EB on a metal layer, for example, an aluminium layer, the electron beam EB can get into the aluminium layer to a depth of about 2 or 3 $\mu$m, this depth being varied by an accelerating voltage of the electron and the material of the metal layer. Note, the intensity of an X-ray generated from the metal (aluminium) layer is determined by the thickness of the metal layer where the electrons are passing. Namely, when the thickness of the metal layer is two times, an intensity of the generated X-ray (K alpha-ray) becomes two times, as the number of electrons colliding with metal atoms is increased by two times. However, in practice, when the thickness of the metal layer is two times, the intensity of the generated X-ray is smaller than two times, as some of the X-rays generated by the collision of electrons and metal atoms are absorbed by the metal layer.

In the present invention, the X-ray generated from the metal layer, or the thickness of the metal in the level-difference alignment mark (i.e., the metal thickness of a flat surface alignment mark), which has an intensity in accordance with the thickness of the metal layer, is used for detecting the alignment mark, when the level-difference is buried under the metal layer, or for detecting the flat surface alignment mark. Note, the irradiation processes of the electron beam EB and the detection processes of the alignment mark are carried out several times in order to obtain high accuracy without introducing a detection noise. Furthermore, the scanning processes of the electron beam EB and detection processes of the alignment mark are not only carried out in an X-direction, but also in a Y-direction.

Figure 4:
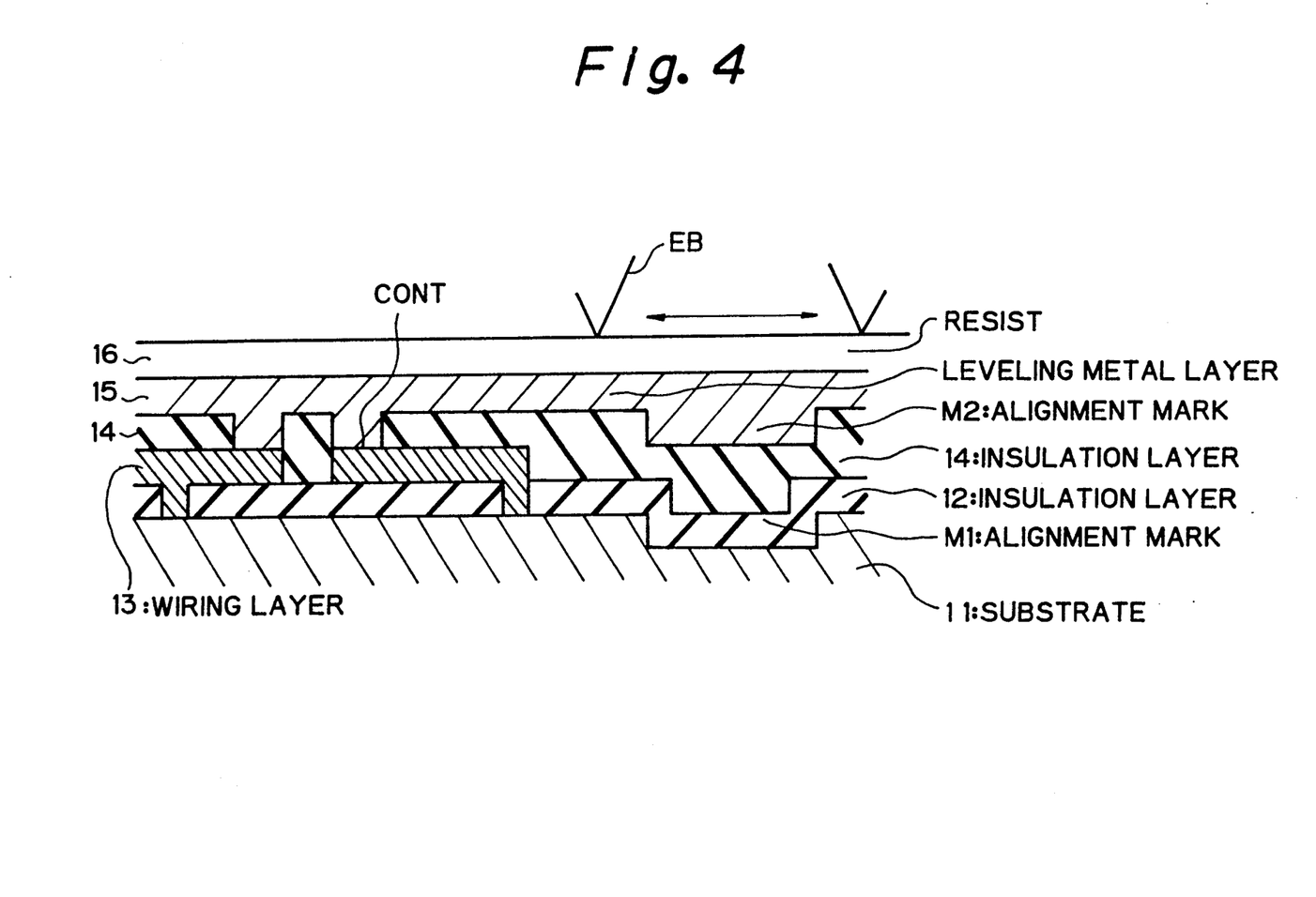
FIG. 4 is a cross sectional diagram indicating a general semiconductor device having a leveling metal layer.

FIG. 4 is a cross sectional diagram indicating a general semiconductor device having a leveling metal layer.

In FIG. 4, a reference numeral 11 denotes a silicon substrate of a single crystal having an alignment mark (level-different alignment mark) M1 formed using an RIE method. Next, an insulation layer (for example, an SiO$_2$ layer) 12 is formed on the substrate 11 by thermal oxidation, and then a wiring layer (for example, a polysilicon layer) 13 is formed on the insulation layer 12. Furthermore, an insulation layer (for example, a SiO$_2$ layer) 14 is formed on the wiring layer 13 using a CVD (Chemical Vapor Deposition) method, and then a leveling metal layer 15 is formed on the insulation layer 14 using a sputtering method. Therefore, the upper part of contact portions and an alignment mark become flattened. Note, a reference numeral 16 denotes a resist.

In FIG. 4, the alignment marks (M1, M2) can be detected by detecting the reflected electrons in the electron beam exposure system before forming a leveling metal layer 15. However, as the alignment mark cannot be detected by detecting the reflected electrons after forming the leveling metal layer 15, in such a case, the alignment mark (flat surface alignment mark) M2 is detected by detecting the generated X-ray.

Figure 5:
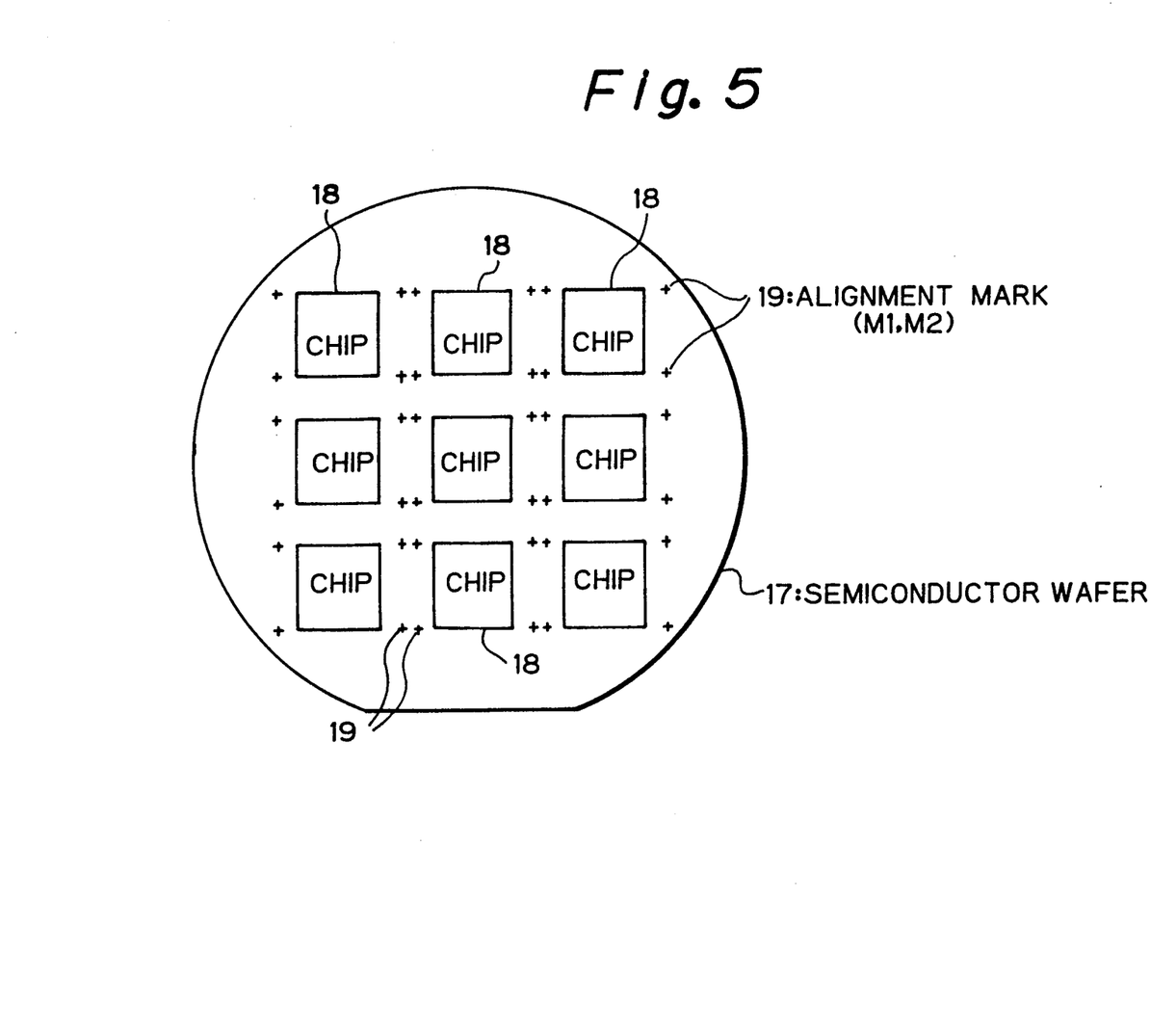
FIG. 5 is a diagram indicating a wafer having a plurality of alignment marks.

FIG. 5 is a diagram indicating a wafer having a plurality of alignment marks.

As shown in FIG. 5, a plurality of chips 18 are formed on a semiconductor wafer 17, and alignment marks 19 (M1, M2) are formed at all corners of the chips 18. Namely, one of the four alignment marks 19 is provided at each of the four corners of each of the chips 18.

Figure 6A:
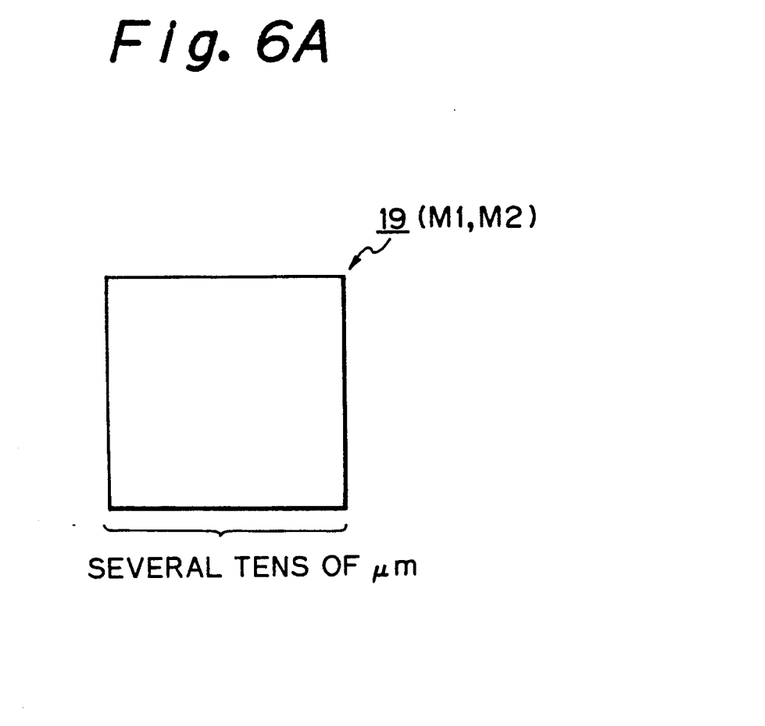
FIGS. 6A and 6B are diagrams indicating an alignment mark shown in FIG. 5.
Figure 6B:
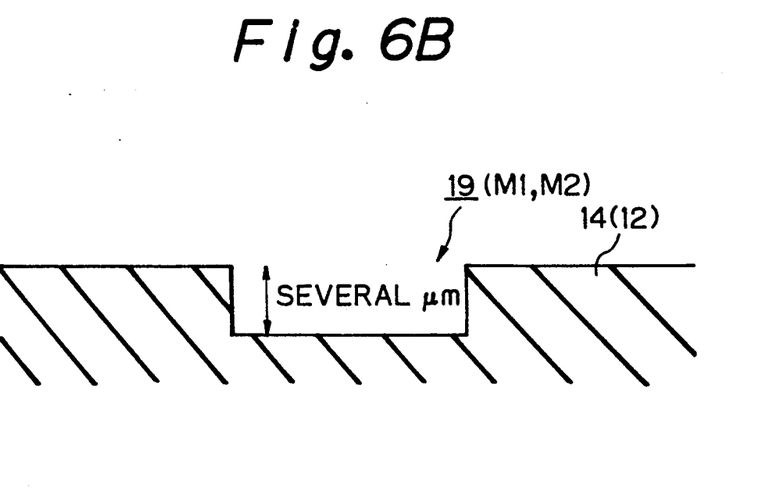

FIGS. 6A and 6B are diagrams indicating an alignment mark shown in FIG. 5. The shape of the alignment mark 19 is, for example, a square of several tens of $\mu$m as shown in FIG. 6A, and the depth of the alignment mark 19 is, for example, about several $\mu$m. Note, the level-difference alignment mark M1 shown in FIG. 1 is obtained when no material layer is formed on the alignment mark 19, and the flat surface alignment mark shown in FIG. 2 is obtained when a leveling metal layer 3 is formed on the alignment mark 19.

Below, the preferred embodiments of an apparatus for detecting an alignment mark of a semiconductor device according to the present invention will be explained.

Figure 7A:
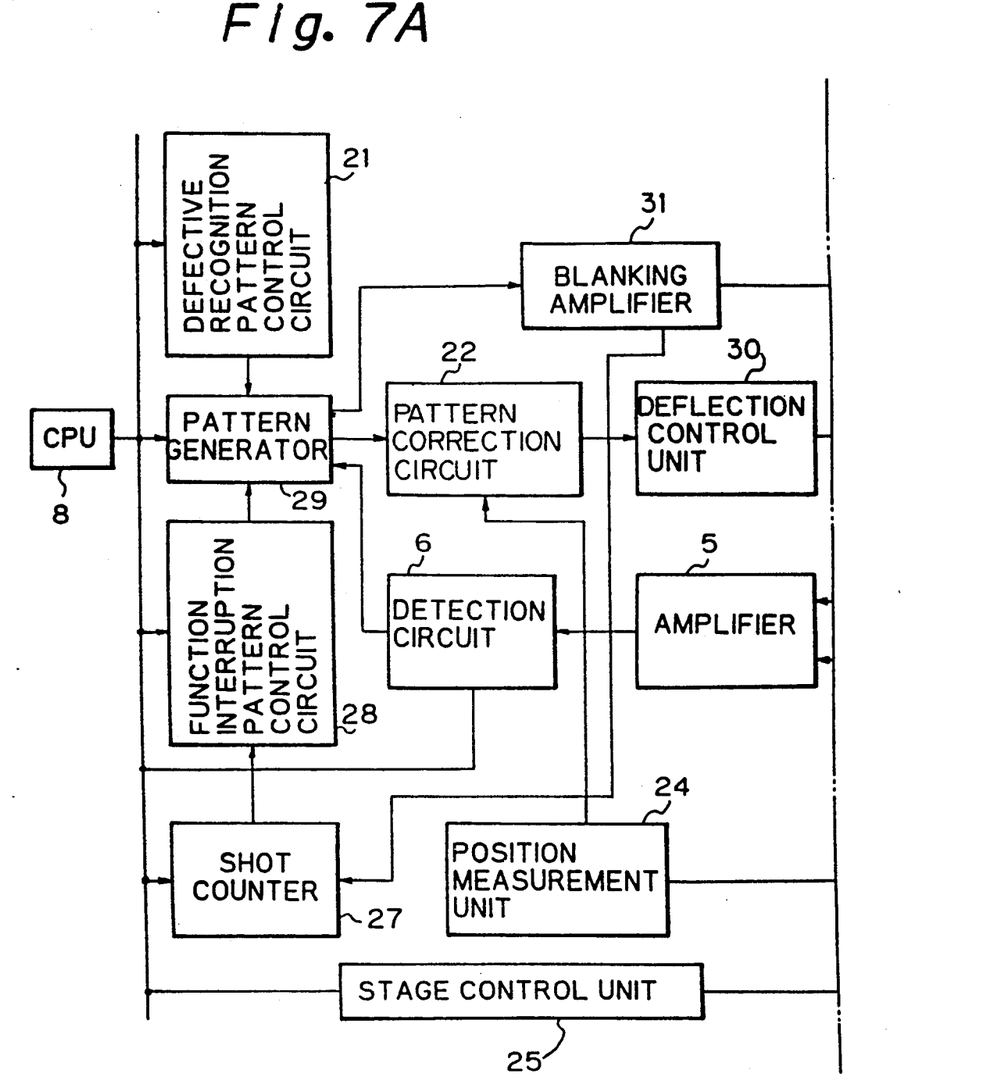
FIGS. 7A and 7B together comprise a block diagram indicating an electron exposure system employing the present invention.
Figures 7B, 7C:
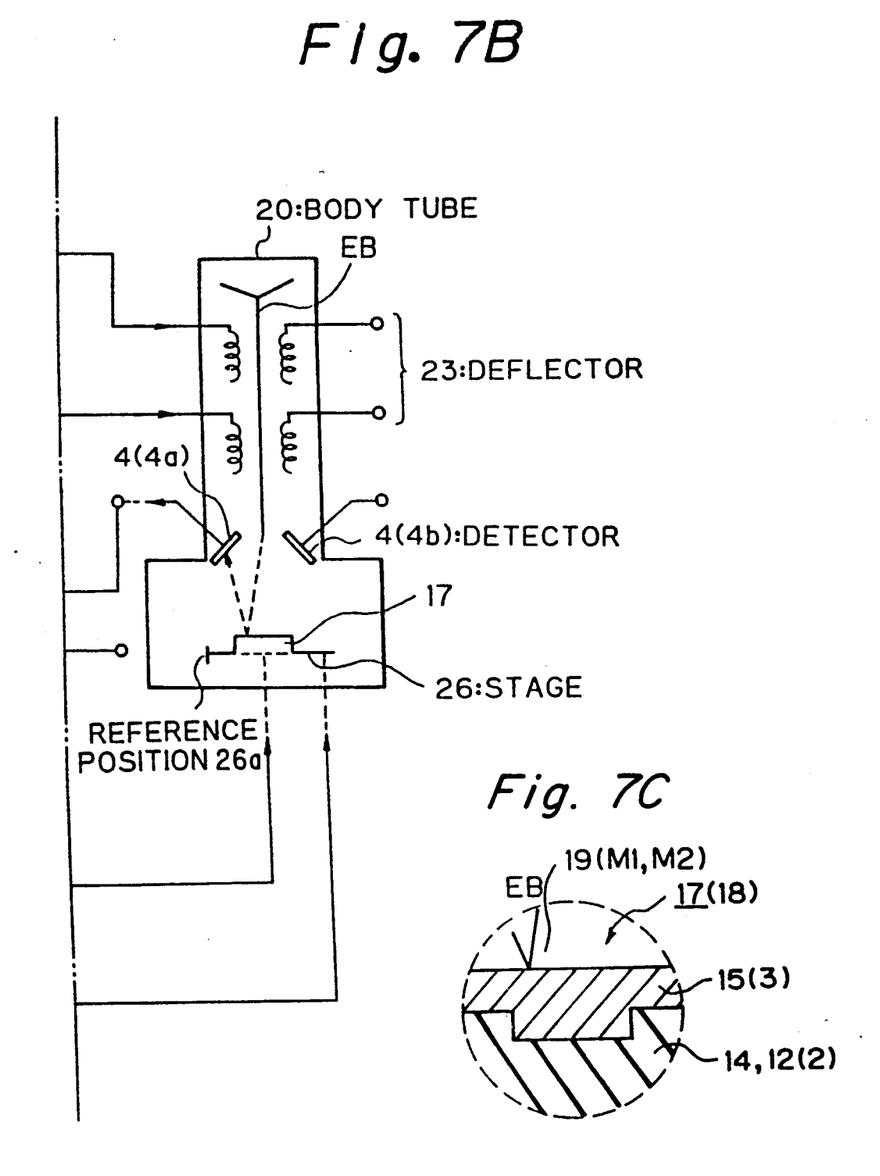
FIG. 7C illustrates a detail of a component of FIG. 7B, on an enlarged scale.

FIGS. 7A and 7B, together, comprise a block diagram of an electron exposure system employing the present invention.

As shown in FIG. 7B, in a body tube 20, a semiconductor wafer 17 is moved in accordance with a movement of a stage 26 which is controlled by a CPU 8 through a stage control unit 25 (FIG. 7A). A present position of the stage 26 is measured and compared with a reference position 26a by a position measurement unit 24, and an output of the position measurement unit 24 is supplied to a pattern correction circuit 22.

The electron beam EB is irradiated and scanned onto the alignment mark 19 (flat surface alignment mark M2, as shown in FIG. 7C). Note, the flat surface alignment mark M2 is defined by a different thickness of the leveling metal layer 15 in the alignment mark 19 having a level-difference. An X-ray, which is generated from a region of the flat surface alignment mark M2 in accordance with the different metal thickness of the flat surface alignment mark M2, is detected by a detector 4. An output of the detector 4 is supplied to a detection circuit 6 through an amplifier 5, and an output of the detection circuit 6 is processed and supplied to the pattern correction circuit 22 through a pattern generator 29.

The direction of electron beam irradiation, or an electron beam pattern is corrected by the pattern correction circuit 22 through a deflection control unit 30 and a deflector 23 in accordance with data from the position measurement unit 24 and the detection circuit 6, and specific patterns are exposed on the semiconductor wafer 17 by the electron beam EB by using the pattern generator 29, a blanking amplifier 31, the deflector 23, and the like. Note, a shot counter 27 is used to count the output of the blanking amplifier 31, a control circuit 28 is used to control function interruption patterns, and a control circuit 21 is used to control defective recognition patterns.

Figure 8:
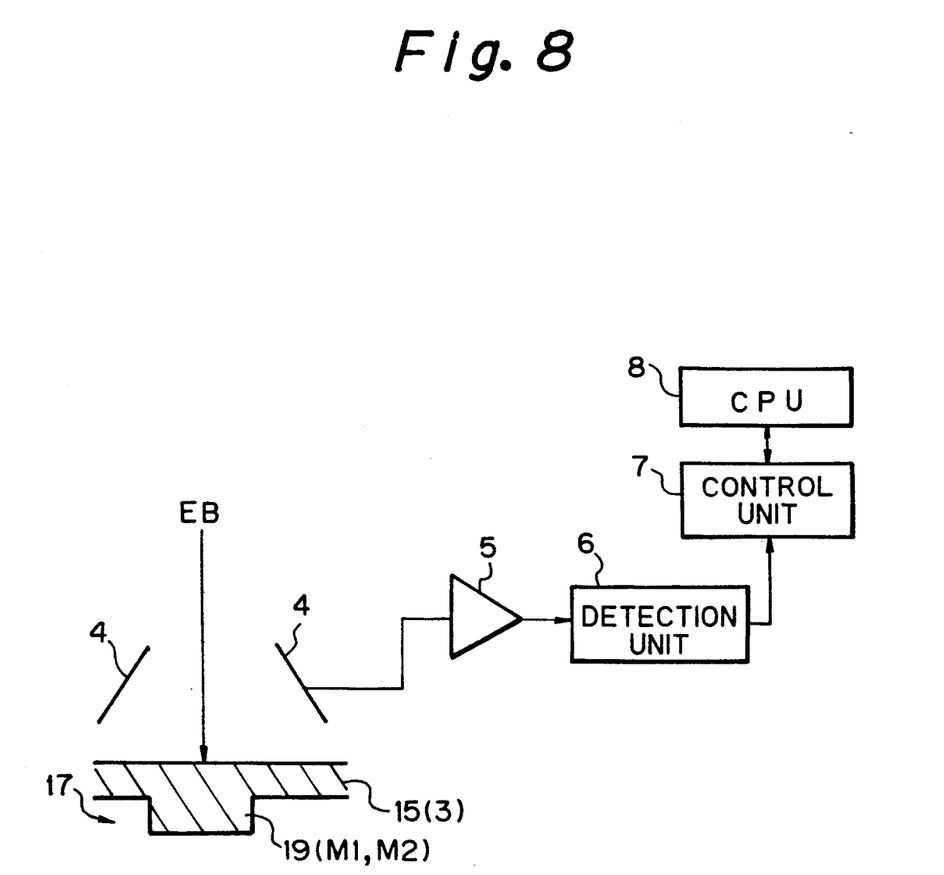
FIG. 8 is a block diagram indicating a first example of an apparatus for detecting an alignment mark of a semiconductor device according to the present invention.

FIG. 8 is a block diagram illustrating a first example of an apparatus for detecting an alignment mark of a semiconductor device according to the present invention. As shown in FIG. 8, this embodiment comprises detectors 4, an amplifier 5, a detection unit 6, a control unit 7, and a CPU 8. In FIG. 8, a leveling metal layer 15 is formed on the alignment mark 19 having a level-difference, and an electron beam EB is irradiated and scanned onto a region of the alignment mark 19, whether a mark M1 (as in FIG. 1) or a flat surface alignment mark M2 (as in FIG. 2).

The detector 4, which is provided over the semiconductor wafer (semiconductor device) 17, is used to detect information generated from the region of the alignment mark 19. If the alignment mark of the semiconductor device is a flat surface alignment mark M2 as shown in FIG. 2, the detected information is an X-ray whose intensity is determined in accordance with the increased thickness of the metal layer 15 in the level-difference alignment mark 19(M2), so that the position of the flat surface alignment mark 19(M2) can be detected.

In FIG. 8, when scanning and exposing an electron beam, a detector 4 only detects an existing X-ray and reflected electrons which are generated by the leveling metal layer 15. An output of the detector 4 is amplified by an amplifier 5, and is filtered by a detection circuit 6 and supplied to a control unit 7. In the control unit 7, the alignment mark is exactly detected by the intensity of the X-ray corresponding to thickness-differences of the leveling metal layer 15. Further, a CPU 8 carrys out various controls in accordance with the detection of the alignment mark. Note, the control unit 7 corresponds to the stage control unit 25 and the deflection control unit 30 in FIG. 7.

Figure 9:
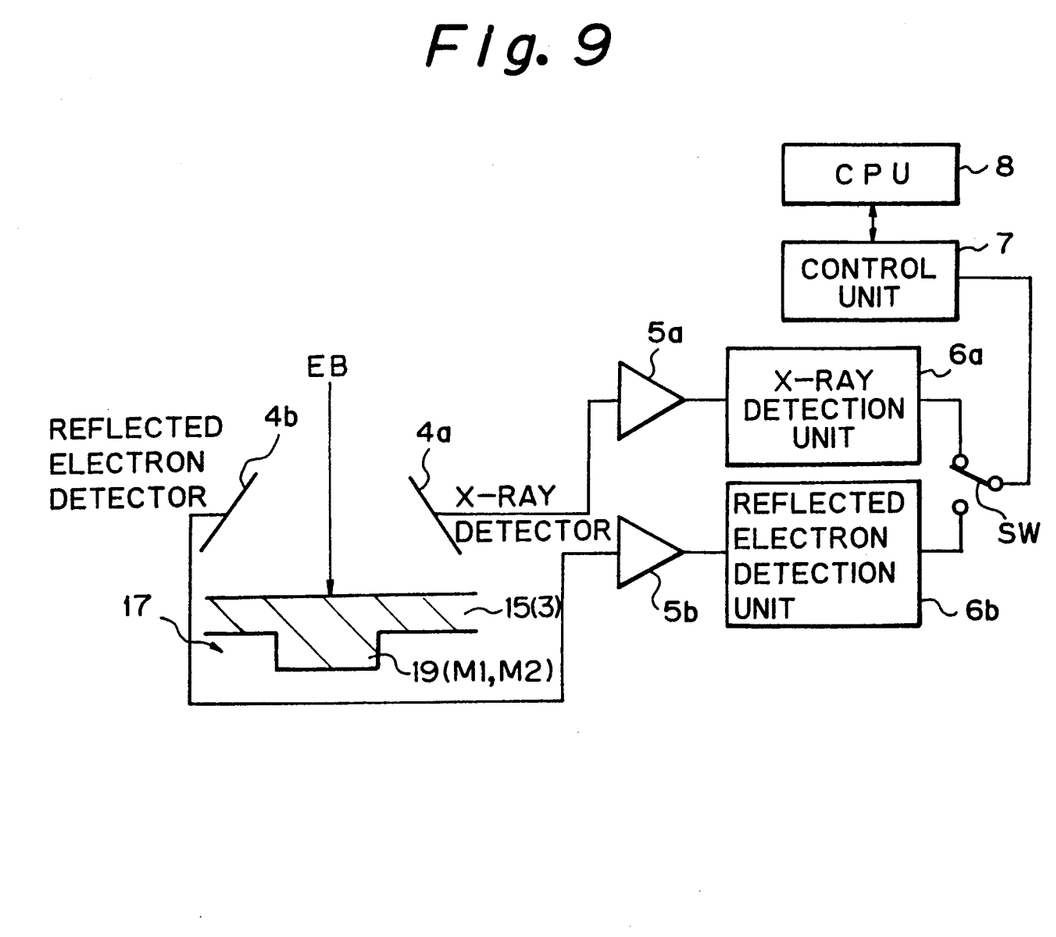
FIG. 9 is a block diagram indicating a second example of an apparatus according to the present invention.

FIG. 9 is a block diagram indicating a second example of the apparatus according to the present invention. As shown in FIG. 9, this embodiment comprises an X-ray detection means and a reflected electron detection means. Namely, this embodiment comprises an X-ray detector 4a, an amplifier 5a, an X-ray detection unit 6a, a reflected electron detection unit 4b, an amplifier 5b, a reflected electron detection unit 6b, a switching means SW, a control unit 7, and a CPU 8. In this embodiment, an irradiating electron beam EB is scanned onto a region of the alignment mark 19 (whether a mark M1 or a flat surface alignment mark M2), an X-ray generated by a flat surface alignment mark M2 only, is detected by the X-ray detector 4a, and electrons reflected by the level-difference alignment mark only are detected by the reflected electron detector 4b.

The X-ray detector 4a, which is provided over the semiconductor wafer 17, is used to detect, only, an X-ray generated from the region of the flat surface alignment mark M2. The reflected electron detector 4b, which is provided over the semiconductor wafer 17, is used to detect, only, electrons reflected by a surface of the level-difference alignment mark. If the alignment mark of the semiconductor device is a flat surface alignment mark M2 as shown in FIG. 2, the intensity of the detected X-ray is determined in accordance with the thickness of the metal layer 15 in the level-difference alignment mark, so that the position of the flat surface alignment mark M2 can be detected. If the alignment mark of the semiconductor device is a level-difference alignment mark M1 as shown in FIG. 1, the intensity of the detected electron is determined in accordance with the surface shape level-difference of the alignment mark M1 so that the position of the level-difference alignment mark can be detected.

The switching means SW, which is connected to both the X-ray detection unit 6a and the reflected electron detection unit 6b, is switched therebetween in accordance with the type of the alignment mark. Namely, when the alignment mark is determined to be a flat surface alignment mark M2, the output of the X-ray detection unit 6a is supplied to the control unit 7 through the switching means SW. Conversely, when the alignment mark M1 is determined to be a level-difference alignment mark, the output of the reflected electron detection unit 6b is supplied to the control unit 7 through the switching means SW.

The control unit 7, which is connected to the switching means SW, is used to detect the position of the flat surface alignment mark M2 or the level-difference alignment mark M1 by the detected X-ray intensity or the detected electron intensity respectively. The CPU 8, which is connected to the control unit 7, is used to carry out various controls in accordance with the detected position of the flat surface alignment mark M1 or the level-difference alignment mark M1. Note, the control unit 7 corresponds to the stage control unit 25 and the deflection control unit 30 in FIG. 7.

Figure 10:
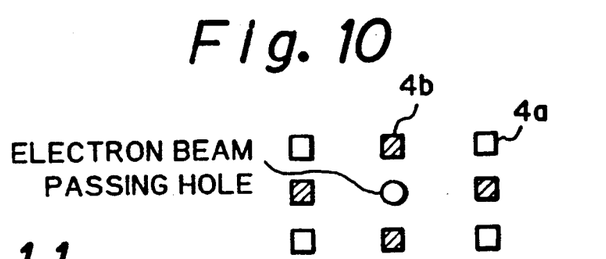
FIGS. 10 and 11 are diagrams indicating examples of arrangements of detectors shown in FIGS. 8 and 9.
Figure 11:
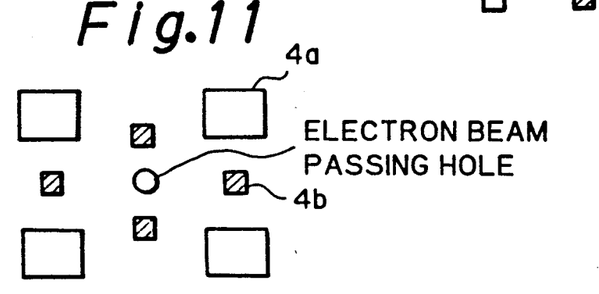

FIGS. 10 and 11 are diagrams indicating examples of arrangements of detectors shown in FIG. 9.

As shown in FIG. 10, the X-ray detector 4a and the reflected electron detector 4b are provided as four units, respectively. Note, the number of the X-ray detectors 4a and the reflected electron detectors 4b are not limited to four, but can be increased in number.

Furthermore, the number of the X-ray detectors 4a can be greater than the number of the reflected electron detectors 4b, as the sensitivity of the X-ray detector 4a is lower than that of the reflected electron detector 4b. As shown in FIG. 11, the X-ray detector 4a can be made larger than the reflected electron detector 4b, as the sensitivity of the X-ray detector 4a is lower than that of the reflected electron detector 4b.

Figure 12:
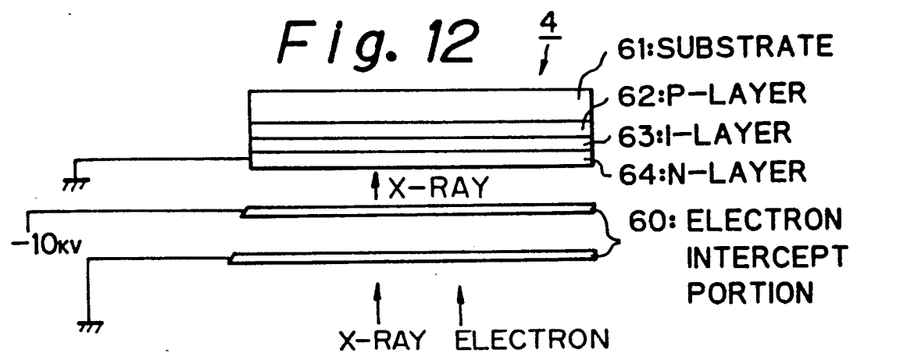
FIGS. 12 and 13 are diagrams indicating configurations of the detectors shown in FIGS. 8 and 9.
Figure 13:
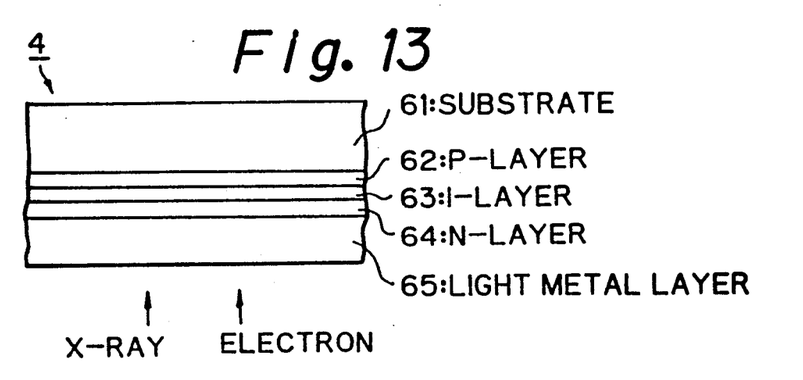

FIGS. 12 and 13 are diagrams indicating configurations of the detectors shown in FIG. 9.

As shown in FIG. 12, the detector 4 comprises an electron intercept portion 60 and PIN-diodes each comprising a substrate 61 and P-, I-, and N- layers 62, 63, and 64, respectively. The electron intercept portion 60, which is oriented in the detector 4 so as to be disposed toward, or exposed to, the semiconductor wafer 17, as shown in FIG. 9, and corresponding to each of the detectors 4a and 4b in FIG. 9, is used to intercept electrons reflected by the surface of the semiconductor wafer 17 or of the level-difference alignment mark 19. The PIN-diodes, which contact the electron intercept portion 60 and each of which comprises a substrate 61, a P-layer 62, an I-layer 63, and an N-layer 64, are used to detect an X-ray passing through the electron intercept portion 60. Note, the electron intercept portion 60 is constituted by two electrode panels to which can be applied a high voltage (for example, −10K Volts), and when the high voltage is applied between the two electrode panels, the reflected electrons are intercepted. Namely, the electrons reflected by the surface of the semiconductor wafer are intercepted when the high voltage is applied to the electron intercept portion 60, and the electrons reflected by the surface of the semiconductor wafer are passed through when the high voltage is not applied to the electron intercept portion 60. In this case, the detector 4 is also used to detect the electrons reflected by the semiconductor wafer in accordance with a surface shape thereof. Furthermore, in the embodiment shown in FIG. 9, the X-ray detector 4a is constructed to apply the high voltage to the electron intercept portion 60, and the reflected electron detector 4b is constructed not to apply the high voltage to the electron intercept portion 60.

As shown in FIG. 13, the detector 4 comprises an electron intercept portion (light metal layer) 65 and PIN-diodes 61, 62, 63, and 64. The electron intercept portion 65, which is provided in the detector 4 so as to be disposed toward, or exposed to, the semiconductor wafer is used to intercept electrons reflected by the surface of the semiconductor wafer or of the level-difference alignment mark. The PIN-diodes have the same configuration as the above PIN-diodes 61, 62, 63, and 64. Note, the electron intercept portion 65 is constituted by a light metal layer, for example, a beryllium layer. In this case, the thickness of the beryllium layer 65 is about 10 μm. This beryllium layer 65 has a function of intercepting electrons at its surface. Consequently, the detector in FIG. 13 functions only as an X-ray detector. Note, this detector shown in FIG. 13 can be used as the X-ray detector 4a in the embodiment shown in FIG. 9.

In accordance with the present invention as described above, even when an alignment mark formed by a level-difference of a semiconductor device is buried under a leveling metal layer, the alignment mark effectively formed by the increased thickness of the leveling metal layer corresponding to the level-difference of the alignment mark can be detected, that is, both a level-difference alignment mark M1 and a flat surface alignment mark M2 can be detected without adding excessive processes, and thus a manufacturing time of the semiconductor device can be shortened when using either or both of the level-difference alignment mark and the flat surface alignment mark.

Many widely differing embodiments of the present invention may be constructed without departing from the spirit and scope of the present invention, and it should be understood that the present invention is not limited to the specific embodiments described in this specification, except as defined in the appended claims.

We claim:

1. A method of detecting a flat surface alignment mark, of a semiconductor device having a main surface, the flat surface alignment mark comprising a level difference alignment mark in said main surface and a portion of a leveling metal layer on said main surface which forms a flat surface above said level-difference alignment mark common with said main surface, wherein said method comprises:
   a step of irradiating and scanning charged particles onto a region of said main surface of said device encompassing said flat surface alignment mark; and
   a step of detecting information generated from the region of said flat surface alignment mark in accordance with the thickness of the metal layer portion in said level difference alignment mark, so that the position of said flat surface alignment mark is detected.

2. A method of detecting an alignment mark of a semiconductor device as claimed in claim 1 wherein said charged particles comprise an electron beam and said information, generated from the region of said alignment mark, is an X-ray intensity.

3. A method of detecting an alignment mark of a semiconductor device having a main surface, a level-difference alignment mark in said main surface and a leveling metal layer on said main surface and above said level-difference alignment mark, wherein said method comprises:
   a step of defining a flat surface alignment mark by providing a different thickness of said leveling metal layer in said level-difference alignment mark than over the remainder of said main surface of said device and thereby defining the flat surface thereof;
   a step of detecting an X-ray generated from said irradiated and scanned region of said flat surface alignment mark, said X-ray varying in intensity in accordance with the different thickness of said metal layer in said flat surface alignment mark; and
   a step of determining the position of said flat surface alignment mark by the change in intensity of said detected X-ray.

4. An apparatus for detecting an alignment mark formed as a level-difference alignment mark in a main surface of a semiconductor device and having a flat surface, said device having a leveling metal layer on said main surface forming said flat surface of said level-difference alignment mark, wherein said apparatus comprises:
   means for irradiating and scanning charged particles onto a region of said main surface encompassing said alignment mark; and
   detection means, positioned over said semiconductor device, for detecting information generated from the region of said main surface encompassing said alignment mark in accordance with the increased thickness of said metal layer in said level-difference alignment mark, so that the position of said alignment mark is detected.

5. An apparatus for detecting an alignment mark of a semiconductor device as claimed in claim 4, wherein said charged particles comprise an electron beam and said information, generated from the region of said alignment mark, is an X-ray intensity.

6. An apparatus for detecting an alignment mark of a semiconductor device as claimed in claim 5, wherein said detection means comprises:
   an electron intercept means, provided in said detection means so as to be disposed toward said semiconductor device, for intercepting electrons reflected by the main surface of said semiconductor device; and
   PIN-diodes, contacting said electron intercept means, for detecting an X-ray passing through said electron intercept means.

7. An apparatus for detecting an alignment mark of a semiconductor device as claimed in claim 6, wherein said detection means further comprises a voltage applying means selectively switched ON and OFF for respectively applying a voltage, or not applying a voltage, to said electron intercept means, so that the electrons reflected by said semiconductor device are intercepted by said electron intercept means when said voltage applying means is switched ON, and the electrons reflected by said semiconductor device are passed through said electron intercept means when said voltage applying means is switched OFF, and said detection means is also used for detecting the electrons reflected by said semiconductor device in accordance with the surface shape of the main surface thereof.

8. An apparatus for detecting an alignment mark of a semiconductor device as claimed in claim 6, wherein said electron intercept means comprises a light metal layer.

9. An apparatus for detecting an alignment mark of a semiconductor device as claimed in claim 8, wherein said light metal layer is a berylium layer.

10. An apparatus for detecting an alignment mark of a semiconductor device as claimed in claim 4, wherein said apparatus is used for an electron beam exposure system.

11. An apparatus for detecting alignment marks of a semiconductor device, said device having a main surface in which are formed a flat surface alignment mark comprising a level-difference mark having a metal layer thereon forming the flat surface thereof, common to said main surface, and a level-difference alignment mark having a different level than the level of said main surface, wherein said apparatus comprises:
   means for irradiating and scanning an electron beam onto corresponding regions of said main surface encompassing said level-difference alignment mark and said flat surface alignment mark;
   first detection means, positioned over said main surface of said semiconductor device, for detecting an X-ray generated from the region of said flat surface alignment mark in accordance with the metal thickness in said flat surface alignment mark;
   second detection means, positioned over said main surface of said semiconductor device, for detecting an electron reflected from the region of said level-difference alignment mark in accordance with the surface shape of said level-difference alignment mark; and
   switching means, connected to said first detection means and said second detection means, for selectively switching to said first detection means and to said second detection means in accordance with the irradiating and scanning of said flat surface alignment mark and of said level-difference alignment mark, respectively.

12. An apparatus for detecting an alignment mark formed in a main surface of a semiconductor device as claimed in claim 11, wherein said apparatus further comprises:
   control means, connected to said switching means, for detecting the position of said flat surface alignment mark or of said level-difference alignment mark, by said detected X-ray intensity, or said detected electron intensity, respectively; and
   a CPU, connected to said control means, for carrying out various controls in accordance with the detected position, respectively, of said flat surface alignment mark or of said level-difference alignment mark.

13. An apparatus for detecting an alignment mark formed in a main surface of a semiconductor device as claimed in claim 11, further comprising plural said first detection means and plural said second detection means.

14. An apparatus for detecting an alignment mark formed in a main surface of a semiconductor device as claimed in claim 11, wherein said first detection means are larger than said second detection means.

15. An apparatus for detecting an alignment mark formed in a main surface of a semiconductor device as claimed in claim 11, wherein said first detection means comprises:
   electron intercept means for intercepting electrons reflected by the main surface of said semiconductor device; and
   PIN-diodes for detecting an X-ray passing through said electron intercept means.

16. An apparatus for detecting an alignment mark formed in a main surface of a semiconductor device as claimed in claim 15, wherein said first detection means further comprises voltage applying means for selectively applying a voltage to said electron intercept means.

17. An apparatus for detecting an alignment mark formed in a main surface of a semiconductor device as claimed in claim 15, wherein said electron intercept means comprises a light metal layer.

18. An apparatus for detecting an alignment mark formed in a main surface of a semiconductor device as claimed in claim 17, wherein said light metal layer is a beryllium layer.

19. An apparatus for detecting an alignment mark formed in a main surface of a semiconductor device as claimed in claim 11, wherein said apparatus is used in an electron beam exposure system.

* * * * *